US006940937B2

(12) United States Patent
Xiu et al.

(10) Patent No.: US 6,940,937 B2
(45) Date of Patent: Sep. 6, 2005

(54) SCALABLE HIGH-SPEED PRECISION FREQUENCY AND PHASE SYNTHESIS

(75) Inventors: Liming Xiu, Plano, TX (US); Zhihong You, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 714 days.

(21) Appl. No.: 10/026,489

(22) Filed: Dec. 24, 2001

(65) Prior Publication Data

US 2003/0118142 A1 Jun. 26, 2003

(51) Int. Cl.[7] .................................................. H03D 3/24
(52) U.S. Cl. ....................... 375/376; 327/147; 327/156; 708/271
(58) Field of Search ................................. 375/375, 376; 327/147, 156, 105; 708/271

(56) References Cited

U.S. PATENT DOCUMENTS 5,126,960 A   6/1992  Thong
5,841,387 A  11/1998  VanBuskirk
6,329,850 B1 * 12/2001 Mair et al. .................. 327/107

OTHER PUBLICATIONS

A "Flying–Adder" Architecture of frequency and Phase Synthesis With Scalability. Xiu et al IEEE vol. 10 No. 5 Oct. 2002. pp. 637–649.*

Mair and Xiu, "An Architecture of High–Performance Frequency and Phase Synthesis", J. Sol. State Circ., vol. 35, No. 6 (IEEE, Jun., 2000), pp. 835–846.

* cited by examiner

*Primary Examiner*—Temesghen Ghebretinsae
(74) *Attorney, Agent, or Firm*—W. Daniel Swayze, Jr.; W. James Brady; Frederick J. Telecky, Jr.

(57) ABSTRACT

A clock synthesis circuit (22) including a phase-locked loop (25) and one or more frequency synthesis circuits (27; 77; 227; 237) is disclosed. A disclosed implementation of the phase-locked loop (25) includes a voltage-controlled oscillator (30) having an even number of differential stages (31) to produce an even number of equally spaced clock phases. In one arrangement, the frequency synthesis circuit (27) includes two adder legs that generate select signals applied to first and second multiplexers (40a, 40b), for selecting among the clock phases from the voltage-controlled oscillator (30). The outputs of the first and second multiplexers (40a, 40b) are applied to a two-to-one multiplexer (46) which is controlled by the output clock signal (CLK1), to drive clock edges to a T flip-flop (48) to produce the output clock signals (CLK1, CLK2). In another embodiment, more than two adder and register units (55) control corresponding multiplexers (56) for selecting clock phases from the voltage-controlled oscillator (30) for application to an output multiplexer (58), which is controlled by a clock control circuit (60) to apply the selected clock phases to the T flip-flop (62). In another embodiment, primary and phase-shifted frequency synthesis circuits (227, 327) receive initialization values (INIT1, INIT2) that establish the phase differential and ensure proper initialization.

18 Claims, 8 Drawing Sheets

SCALABLE HIGH-SPEED PRECISION FREQUENCY AND PHASE SYNTHESIS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to clock synthesis circuits for generating periodic signals of selected frequency and phase for use in integrated circuits.

As is fundamental in the art, many modern electronic systems now include numerous integrated circuits that operate in conjunction with one another. In complex high performance systems such as modern personal computers and workstations, these integrated circuits are synchronized with a system clock. In consumer-oriented systems such as televisions and home theaters, for example, system operation is synchronized with respect to a synchronization pulse that is included within the display signal itself. In these and other electronic systems, the generation of periodic signals for clocking the operation of circuit functions based upon a system clock or synchronization pulse, is a common and often critical function.

A conventional approach for generating periodic signals based upon a reference clock utilizes the well-known phase-locked loop, or PLL. In general, PLL circuits operate by comparing the time at which an edge of a reference clock is received relative to a corresponding edge of an internally generated clock. If a significant delay between these two edges is detected, the generation of the internal clock is adjusted to more closely match the received reference clock. In conventional analog PLLs, the frequency of a voltage controlled oscillator is adjusted by a filtered signal from a phase detector that compares system and chip clocks, so that the instantaneous frequency of the internal chip clock is advanced or retarded depending upon whether the chip clock lags or leads the system clock. Analog PLLs therefore adjust the phase of the chip clock in a substantially continuous manner in response to a phase difference between the internal chip clock and the system clock. This smooth operation generally depends upon the filtering of the output of the phase detector circuit, but can be made quite well-behaved in most implementations. Additionally, by inserting frequency dividers in the forward and feedback loops, analog PLLs can be used to generate periodic signals of a selectable frequency multiple of the input reference clock.

Modern digital integrated circuits generally use digital circuitry to generate multiple internal chip clocks that are based upon the output of a PLL. However, these digitally-generated clock signals can only be adjusted to a discrete accuracy that corresponds to the minimum step size of the digital clock generation circuitry. This incremental change in phase is often noticeable, particularly at high frequencies. The resulting "phase jitter" is now a commonly specified parameter for digital clock circuitry, as this effect is often a limiting factor in the accuracy and performance of the circuit.

In addition to phase jitter, the performance of PLL-based clock circuits in response to phase drift is another important parameter. Phase drift, which refers to the variation in the phase of a generated clock relative to the reference clock over time, can be caused by the accumulation of error over a number of clock cycles. Additionally, phase drift can also be caused by temperature and power supply voltage variations, and system noise.

Certain applications of clock generation circuitry are more sensitive to one of these parameters than to the other. A particularly difficult circuit application of clock generation circuitry is the video decoding of television signals (transmitted or recorded) into digital data for computer display or digital video processing. As is well known in the art, conventional television signals included a synchronization pulse at the beginning of each scan line; in the case of a broadcast signal, this synchronization pulse is transmitted, while in the case of a video tape, the synchronization pulse is part of the recorded information. Color information is communicated within each scan line by way of the phase relationship of the color burst signal for each horizontal display location to the synchronization pulse. In order to achieve the desired accuracy in the displayed image, a video decoder system must be able to resolve relatively small phase variations (e.g., on the order of 10□) in the color burst signal which occur at relatively long times (e.g., as long as 160 μsec after a 16 MHz synchronization pulse). In order to carry out the desired video decoding of such a signal, the video decoder must be capable of generating a clock signal that has very little drift over time, for example with as little as 1 nsec drift over 160 μsec.

Known clock generator circuits based on a phase-locked loop (PLL) are described in Mair and Xiu, "An Architecture of High-Performance Frequency and Phase Synthesis", *J. Solid State Circ.*, Vo. 35, No. 16 (IEEE, June, 2000), pp. 835–46, and in copending and commonly assigned application Ser. No. 09/472,268, filed Dec. 27, 1999, both incorporated herein by this reference. In this clock circuit, the voltage controlled oscillator (VCO) of the PLL produces a plurality of evenly-spaced output phases, each at frequency that is locked to a reference clock. A register stores a digital value that selects the desired phase to be applied to the clock input of a toggle flip-flop from which the output clock is generated. A frequency synthesis circuit adds integer and fraction portions of an incoming frequency selection value to the current contents of the register. The fraction portion of the frequency selection value permits a time-averaged clock frequency to be produced with more precision than would be attained by the integer portions selecting the multiple VCO output phases. This article also describes alternative realizations, including multiple frequency synthesis circuits based upon the same PLL (25), and the generation of a phase-shifted secondary output from a phase synthesis circuit that is slaved to the frequency synthesis circuit. Additional performance is obtained by providing separate paths for producing the leading and trailing edges of the output clock.

FIG. 1 illustrates an example of one of the frequency synthesis circuits described in the Mair and Xiu article. In FIG. 1, clock generation circuit 122 includes PLL 125, frequency synthesis circuit 127 for generating a clock signal on line COUT that is at a selected frequency, and phase synthesis circuit 129 for generating a second clock signal on line CSHOUT that is in a fixed phase relationship, and identical frequency, with the clock signal on line COUT. In frequency synthesis circuit 127, thirty-two equally spaced clock phases generated by a VCO in PLL 125 are received at inputs of multiplexer 134. The selected one of the clock phases indicated by select lines SEL appears at the output of multiplexer 134 and is applied to the clock input of D-type flip-flop 136, which is connected in toggle fashion. This inverting output of flip-flop 136 drives the output clock signal on line COUT.

The selection of clock phases by multiplexer 134 according to this preferred embodiment of the invention is determined by an input value presented on lines FREQ, which include both an integer portion and a fractional portion, and is applied to one input of adder 138. The integer portion has a number of bits corresponding to the number of select lines SEL, and thus corresponding to the number of clock phases output by PLL 125. The fractional portion provides additional resolution in the selection of the time-averaged frequency of the output clock signal on line COUT. Adder 138 adds the digital value on lines FREQ with a feedback value from the current output of register 140, and applies this sum to register 140, which is clocked by the output of multiplexer 134. The output of the integer portion of register 140 drives lines SEL applied to multiplexer 134, while the outputs of the integer register and the fraction register of register 140 are together combined into a ten-bit value that is applied back to adder 138 as feedback. In this way, adder 138 adds the current contents of register 140, which includes the current phase selection state applied to multiplexer 134 on lines SEL, to the frequency selection value on lines FREQ, for use in the selection of the next clock phase.

Phase synthesis circuit 129 includes multiplexer 144 which receives the multiple phases generated by PLL 125, and forwards a phase, selected by the digital value on lines SELPH, to the clock input of D-type flip-flop 146. The D input of flip-flop 146 receives the non-inverting output of flip-flop 136 in frequency synthesis circuit 127, and generates the output clock signal on line CSHOUT from its inverting output. Lines SELPH are generated from register 143, which receives a value from adder 142 corresponding to the sum of the current value of lines SEL of frequency synthesis circuit 127 and a digital input value presented on lines PHASE from control circuitry elsewhere within the device.

In operation, the digital value on lines FREQ thus corresponds to the number of phases output from PLL 125 that are to elapse between successive edges of the output clock signal on line COUT. The fractional component of this value provides additional precision in the average output frequency, because these fractional values accumulate and carry in such a manner as to modulate the integer output on lines SEL, and thus modulate the position of the clock edges selected by multiplexer 134. The digital value on lines PHASE indicating the desired phase relationship between the clock signals on lines COUT, CSHOUT is added by adder 142 with the current value of the phase presented on lines SEL; the resulting sum is stored in register 143 and is presented to multiplexer 144 on lines SELPH. Multiplexer 144 then selects the corresponding phase from PLL 125 for application to the clock input of flip-flop 146. Upon the rising transition of this selected clock phase, flip-flop 146 stores the current contents of flip-flop 136 (non-inverted) and applies this state at its inverting output on line CSHOUT.

FIG. 2 illustrates another example of one of the frequency synthesis circuits described in the Mair and Xiu article. In FIG. 2, frequency synthesis circuit 152 generates a clock signal in a pipelined manner, by way of separate paths 152a, 152b for generating the leading and trailing edges of an output clock signal on line COUT. Each of paths 152a, 152b includes a respective thirty-two to one multiplexer 154a, 154b for selecting one of the thirty-two equally-spaced clock phases output by a voltage controlled oscillator (VCO) in a conventional phase-locked loop (PLL) (not shown). Digital select signals, for selecting the corresponding phase, are presented on lines SELa, SELb, from accumulator 150 and adder 160, respectively. In this example, therefore, sixty-four potential phases are available for use in the generation of the output clock signal on line COUT, requiring six integer bits to select among the potential phases. According to this preferred embodiment of the invention, an input digital signal on lines FREQ selects the output frequency, with the most significant five bits FREQ[32:28] forwarded, via adder 159, to adder 160 in path 152b to generate the trailing edge of the output clock signal, and with the thirty-two least significant bits FREQ[31:0] forwarded to accumulator 150 in path 152a. Adder 159 determines the duty cycle of the output clock by adding a five-bit value received on lines DUTY to the most significant bits of lines FREQ. The output of adder 159 is then applied to adder 160, for generation of the trailing edge of the output clock signal.

In this conventional circuit, the outputs of multiplexers 154a, 154b are to corresponding NAND gates 155a, 155b, respectively. The outputs of NAND gates 155a, 155b are applied to the clock inputs of D-flip-flops 156a, 156b, which are connected in toggle fashion as shown. The outputs of flip-flop 156a, 156b are forwarded to inputs of exclusive-OR gate 158a and exclusive-NOR gate 158b, which drive clock phases CLKa, CLKb, respectively. Line CLKa is connected to a second input of NAND gate 155a and to a clock input of adder 160, and line CLKb is connected to a second input of NAND gate 155b and to clock inputs of accumulator 150 and adder 160.

In path 152a, multiplexer 154a is controlled by lines SELa generated by accumulator 150; similarly, in path 152b, multiplexer 154b is controlled by lines SELb generated by adder 160. Each of accumulator 150 and adder 160 are constructed in a pipelined fashion, so that accumulator 150 is performing the appropriate operations to generate its next value on lines SELa during such time as the trailing edge of the clock signal on line COUT is being generated by path 152b, and so that adder 160 is generating its next value for lines SELb during such time as the leading edge of the clock signal on line COUT is propagating through path 152a. Paths 152a, 152b are synchronized by line D2U, which effectively communicate the value on lines SELa from accumulator 150 to adder 160.

Pipelined accumulator 150 generates a five-bit integer result and a twenty-seven bit fraction result, based on the sum of its current contents and the least significant bits of signal FREQ. The integer result is output on select lines SELa to multiplexer 154a, is also forwarded to adder 160 on lines D2U, and is combined with the fraction result to be added in the next cycle. Pipelined adder 160 receives the five most significant lines FREQ [32:28] (via adder 159) and adds this value with the integer received from accumulator 150 on lines D2U, to determine the value on lines SELb applied to multiplexer 154b in path 152b. Each of accumulator 150 and adder 160 is preferably pipelined so that each has one full cycle of output clock time to finish its respective function.

In operation, control circuitry elsewhere within the integrated circuit in which frequency synthesis circuit 152 presents a digital word on lines FREQ indicating the frequency at which the clock signal on line COUT is to be generated by indicating the number of phases of the PLL output between adjacent edges of the output clock. The digital word on lines FREQ has both an integer portion and a fraction portion which together set the time-averaged frequency of the clock signal on line COUT; optionally, a duty cycle selection value on lines DUTY to adder 159. During generation of the leading edge of the output clock signal, line CLKa is high to enable the output of multiplexer 154a to toggle flip-flop 156a, during which time line CLKb is low. Lines CLKa, CLKb are necessarily complementary to one another, considering that exclusive-OR gate 158a and exclusive-NOR gate 158b receive the same inputs but generate opposite output states relative to one another. During such time as the rising edge of the output clock is being generated through path 152a, path 152b is updating the value of its selection integer to be applied to multiplexer 154b on lines SELb. During the time that line CLKa is high and line CLKb is low, the output of NAND gate 155b is forced high, blocking pulses from multiplexer 154b from affecting the state of flip-flop 156b. At this time, the output of accumulator 150 is applied to multiplexer 154a to select a corresponding VCO phase which, on its trailing edge, causes NAND gate 155a to make a low-to-high transition, toggling flip-flop 156a to now match the output of flip-flop 156b (these states being complementary previously). This toggling causes the output of exclusive-OR gate 158a to make a high-to-low transition, and also causes the output of exclusive-NOR gate 158b to make a low-to-high transition, thus issuing a rising edge of the output clock on line COUT and driving line CLKb from low to high. Line CLKa is of course driven low by exclusive-OR gate 158a, locking out NAND gate 155a from responding to the output of multiplexer 154a.

Once line CLKa is low and line CLKb is high, path 152b selects the phase from VCO 30 for use in generating the trailing edge on line COUT, by operation of multiplexer 154b. During this time in which line CLKa is low, blocking transitions from multiplexer 154a from toggling flip-flop 156a, accumulator 150 is updating its contents for the next cycle. The next trailing edge of this phase is then passed to NAND gate 155b which, because line CLKb is now high, toggles the state of flip-flop 156b, causing its output to now differ from that of flip-flop 156a. This state causes exclusive-NOR gate 158b to drive line COUT low again, along with line CLKb. These same inputs cause exclusive-OR gate 158a to drive a low-to-high transition at its output on line CLKa, ending the cycle.

The circuits of FIGS. 1 and 2, which are described in the Mair and Xiu article, provide important improvements in the generation of clock signals in integrated circuits, including precise selection of clock frequencies with minimal drift, with performance suitable for applications requiring extremely high frequency accuracy. However, certain limitations are present in each of these circuits.

One such limitation is present in the circuit of FIG. 1, as a result of multiplexers 134, 144. Each of these multiplexers are m-to-one multiplexers, with m being greater than two (e.g., thirty-two in the example described in the Mair and Xiu article). It has been observed that these m-to-one multiplexers are vulnerable to the generation of "glitches" upon switching, because of the multiple-bit select values. For example, a 32-to-1 multiplexer 134 requires a five-bit select value. The worst case for glitch generation occurs with all five bits switching simultaneously from one selection to another, for example from $00000_2$ to $11111_2$. Because there can be no guarantee that all five bits will be switched by registers 140, 143 at exactly the same instant, it is entirely likely that an intermediate value (e.g., $10110_2$) could be applied to multiplexers 134, 144 for a finite period of time. If multiplexers 134, 144 respond quickly enough, or if the skew is long enough, this intermediate select value can result in the application of the corresponding VCO output to the clock input of the corresponding flip-flop 136, 146, causing an unwanted toggling of clock signals COUT, CSHOUT. The circuit of FIG. 1 is therefore vulnerable to inaccuracy in some instances, especially as the operating frequency is increased.

In addition, still referring to the circuit of FIG. 1, all possible phase shifts (0° to 360°) are not available for the phase differential between the clock signals on lines COUT and CSHOUT. Instead a "dead zone" of unavailable phase shifts is necessarily present, because of the non-zero propagation delay of adder 142. Values on lines PHASE corresponding to phase shifts that are within this propagation delay, from the non-shifted output on line COUT, will not propagate to multiplexer 144 in time to clock out a proper signal on line CSHOUT.

It has also been observed that the performance of the circuit of FIG. 2 has certain timing constraints. In particular, relationships between the propagation delays of the two paths 152a, 152b result from their interlocking nature. As described in the Mair and Xiu article, the sum of the clock-to-output delay of the final register in accumulator 150 plus the decode delay of multiplexer 154a plus the propagation delay of multiplexer 154a itself is the lower limit of the time duration between a rising edge of the output clock and the next falling edge. Similarly, the sum of the propagation delay of gate 155a plus the clock-to-output delay of flip-flop 156a plus the propagation delay of gate 158a is the lower limit of the time duration between the falling edge of the output clock and its next rising edge. While proper design may provide good performance for this circuit, these propagation delay sums limit the ultimate clock speed of the circuit. Other limitations in the performance of this circuit arise from propagations delay through accumulator 150, especially because of its large size. This circuit, because of its thirty-two-to-one multiplexers 154a, 154b, is also vulnerable to glitches as discussed above.

BRIEF SUMMARY OF THE INVENTION

It is therefore an object of this invention to provide a clock synthesis circuit and method of synthesizing a clock signal that overcomes performance limitations of known clock synthesis circuits.

It is a further object of this invention to provide such a circuit and method in which ambiguous initialization of the circuit is avoided.

It is a further object of this invention to provide such a circuit and method in which performance can be improved in a scalable fashion.

It is a further object of this invention to provide such a circuit and method in which phase-shifted versions of the output can be synthesized at any phase relationship relative to one another.

It is a further object of this invention to provide such a circuit and method in which a double frequency version of the synthesized output clock is made available.

Other objects and advantages of the present invention will be apparent to those of ordinary skill in the art having reference to the following specification together with its drawings.

The present invention may be implemented in a clock synthesis circuit in which two or more frequency synthesis paths terminate at the inputs of a multiplexer, the output of which toggles a toggle mode bistable multivibrator (T flip-flop). Sequential selection of the synthesis paths is controlled in a synchronized manner with the output of the circuit, so that the synthesis path outputs sequentially toggle the flip-flop. In this way, the number of synthesis paths can be increased arbitrarily, with the scaling limited only by the fan-in of the multiplexer. The propagation delay paths of each synthesis path can then extend to the multiple periods of the output clock, making higher output frequency possible. In addition, the toggle signal operates as a double-frequency clock signal.

According to another aspect of the invention, a phase-shifted output can also be generated in parallel with the primary synthesized clock. Initialization values are provided to each of the primary and phase-shifted legs, to ensure initialization into a known state. The initialization also eliminates a "dead zone" of unavailable phase relationships.

DETAILED DESCRIPTION OF THE INVENTION

Figure 3:
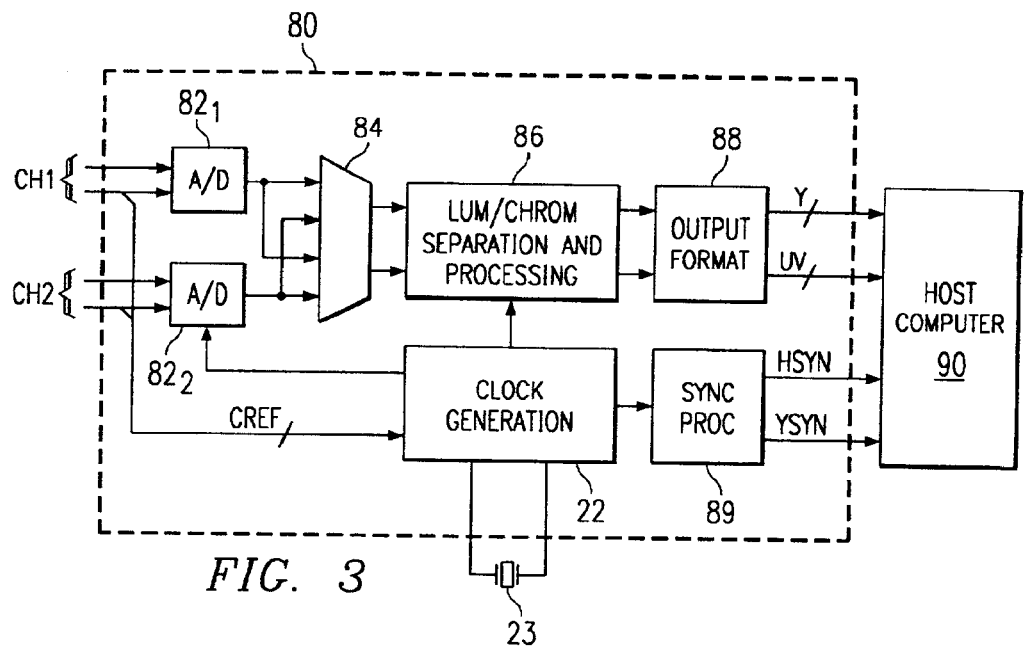
FIG. 3 is an electrical diagram, in block form, of a video decoder including a clock generation circuit constructed according to the preferred embodiments of the invention.

Referring now to FIG. 3, an exemplary implementation of the present invention in connection with a video decoder will now be described, considering that this invention is particularly beneficial in connection with decoding a color video signal. Those skilled in the art having reference to this specification will also understand that this invention may also be used in connection with other frequency synthesis applications. It is therefore to be understood that this description is presented by way of example only.

As shown in the exemplary system of FIG. 3, video decoder 80 receives two input channels CH1, CH2 of video signals; the video signals on channels CH1, CH2 in this example are analog signals, such as according to the NTSC standard. The output of video decoder 80, as presented to host computer 90 in the example of FIG. 3, are digital signals corresponding to the display information presented on lines Y, UV, and horizontal and vertical synchronization signals on lines HSYN, VSYN, respectively. Based on these decoded digital signals, host computer 90 processes these digital signals in the desired manner, for example to perform digital image processing, digital video capture, and digital video and image editing, as well as to display the decoded information on a display monitor (not shown) directly or over a video conferencing system.

Video decoder 80 in this exemplary implementation includes circuitry for performing video decoding operations, similar to the TVP5020 video decoder available from Texas Instruments Incorporated. In this regard, video decoder 80 includes analog-to-digital conversion functions (A/D) $82_1$, $82_2$ for sampling and filtering the analog input video signals on channels CH1, CH2, respectively; automatic gain control and other analog processing may also be applied as desired. The digital outputs from (A/D) $82_1$, $82_2$, including both luminance and chrominance information, are applied by way of multiplexer 84 to luminance and chrominance separation and processing function 86. Upon the desired processing performed by function 86, digital signals are generated by output formatter 88, and communicated to host computer 90 over digital lines Y, UV. Additionally, sync processor 89 generates the appropriate timing information corresponding to vertical and horizontal synchronization signals, and presents the same to host computer 90 by clock signals on lines VSYN, HSYN, respectively.

In order for the operation of luminance and chrominance separation and processing function 86 to accurately decode the incoming video signals, function 86 must be properly synchronized with the sync information contained within the incoming signals CH1, CH2. According to the preferred embodiments of the invention, therefore, video decoder 80 includes clock generation circuit 22 which receives a reference clock signal on line CREF that is based upon external crystal 23, and which generates the appropriate internal clock signals for application to function 86, as well as to A/D functions 82 and sync processor 89. The frequencies and phases of these various clock signals generated by clock generation circuit 22 may vary for each of the respective functions in video decoder 80, as will be described below.

Figure 4:
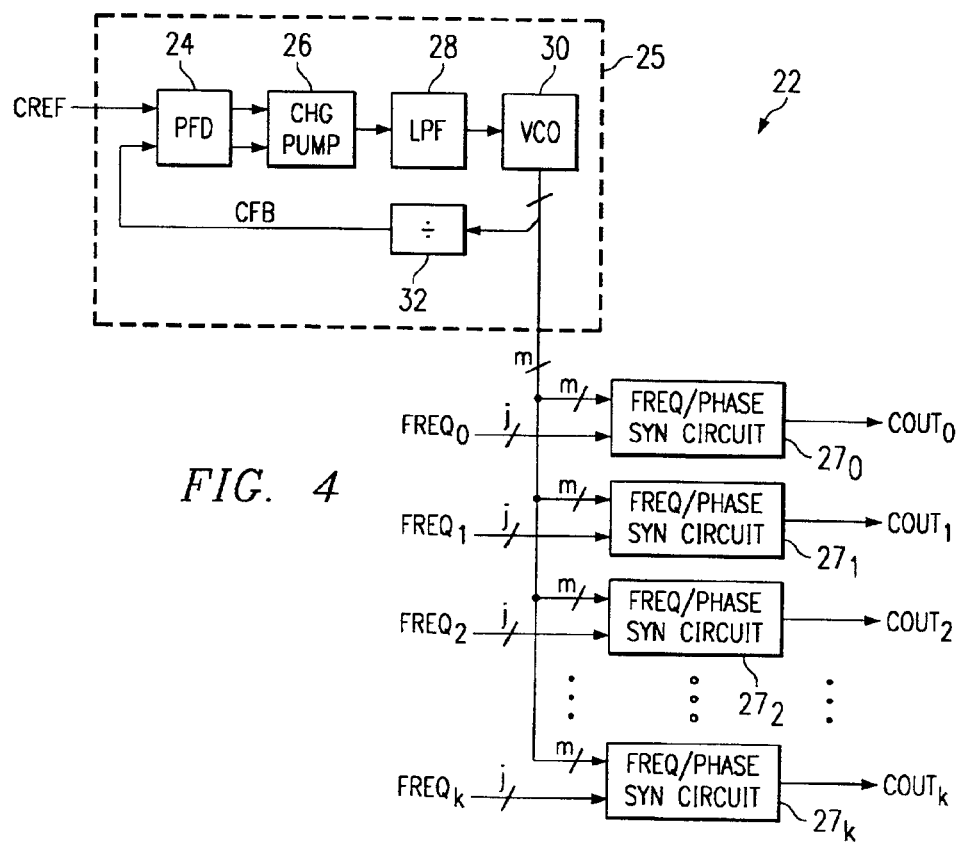
FIG. 4 is an electrical diagram, in block form, of a clock generation circuit constructed according to the preferred embodiments of the invention.

Referring now to FIG. 4, the construction of clock generation circuit 22 according to a first preferred embodiment of the present invention will now be described in general. Clock generation circuit 22 is a phase-locked loop (PLL) based clock circuit, and as such includes PLL 25 which generates multiple phases of a clock signal, phase-locked to a reference clock received on line CREF.

Phase-locked loop (PLL) 25 in clock generation circuit 22 according to this embodiment of the invention is of conventional construction. As such, PLL 25 includes phase-frequency detector (PFD) 24 that compares the relative phases of a reference clock on line CREF and feedback clock on line CFB, and drives charge pump 26 in response thereto, to produce a voltage corresponding to this phase difference. Low pass filter 28 filters the voltage from charge pump 26 to produce a control voltage for voltage controlled oscillator (VCO) 30. VCO 30 generates a periodic waveform at a frequency controlled by the filtered control voltage from low pass filter 28, based on the phase difference detected by PFD 24. According to this example, VCO 30 provides m equally-spaced phases of its output clock signal. For example, thirty-two phases of the output clock signal may be generated by VCO 30; of course, the number of phases desired may vary from this exemplary number as desired. In the conventional manner, one of these clock signals is used as feedback clock CFB, after division by frequency divider 32.

Figure 5A:
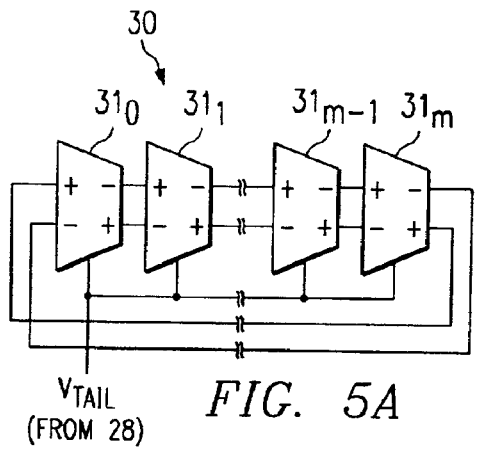
FIGS. 5a and 5b are electrical diagrams, in block and schematic form respectively, of the construction of a voltage-controlled oscillator used in connection with the preferred embodiments of the invention.
Figure 5B:
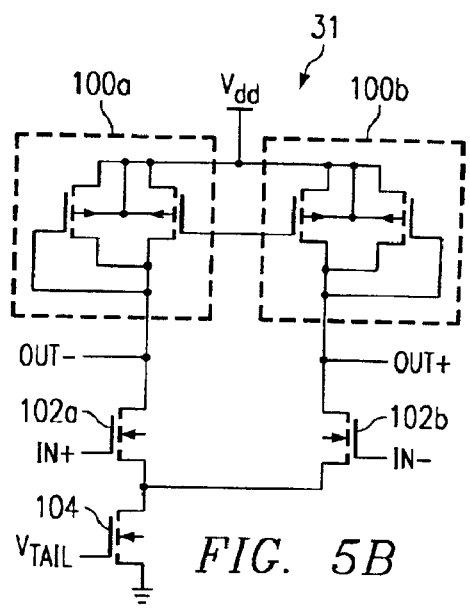

FIGS. 5a and 5b illustrate the construction of VCO 30 according to the preferred embodiments of the invention. According to this preferred construction, VCO 30 includes an even number of stages $31_0$ through $31_m$, making an even number of clock phases available for output. As shown in FIG. 5a, each stage 31 is a differential delay stage, having positive and negative inputs and outputs. The positive and negative outputs of differential delay stages $31_0$ through $31_{m-1}$ are connected to the negative and positive inputs, respectively, of differential delay stages $31_1$ through $31_m$; oscillation is enabled by the positive and negative outputs of last differential delay stage $31_m$ being connected to the positive and negative inputs, respectively, of first differential delay stage $31_0$. Because each differential delay stage 31 has two outputs, a sequence of sixteen differential delay stages 31 (m=15) will provide thirty-two clock phase outputs.

Referring to FIG. 5b, the construction of differential delay stages 31 will be described, by way of example. Each differential delay stage 31 includes two legs. One leg includes load 100a and pull-down device 102a, while the other includes load 100b and pull-down device 102b. Each of loads 100 include, in this example, a pair of p-channel metal-oxide-semiconductor (MOS) transistors having their source-to-drain paths connected in parallel between a power supply voltage $V_{dd}$ and the drain of their corresponding n-channel MOS pull-down device 102; the gates of one transistor of each load 100 are connected in common to the drain of its corresponding pull-down device 102; the gates of the other transistors in loads 100a, 100b are connected in common with one another. The source of each of pull-down devices 102a, 102b is connected to the drain of tail n-channel MOS transistor 104, which has its source at ground and its gate receiving a voltage $V_{TAIL}$. The gates of pull-down devices 102a, 102b correspond respectively to the positive and negative inputs IN+, IN− of VCO 30, and the drains of pull-down devices 102a, 102b correspond respectively to the negative and positive outputs OUT−, OUT+ of VCO 30.

In operation, the voltage $V_{TAIL}$ is the filtered voltage from PFD 24 via LPF 28 (FIG. 4). Voltage $V_{TAIL}$ is applied to each of differential delay stages 31, and controls the duration of the delay in each differential delay stage 31 by limiting the pull-down current through the one of pull-down devices 102a, 102b that is turned on by the signal at its corresponding gate (IN+, IN−). As noted above, the connection of the inputs and outputs of differential delay stages 31 ensures that their outputs oscillate at a frequency determined by the pull-down currents, as these currents determine the switching time of each differential delay stage 31. In this manner, the voltage $V_{TAIL}$ controls the frequency of oscillation of VCO 30, in conventional VCO manner.

Conventional VCOs incorporate an odd number of inverter stages for oscillation, which requires the downstream accumulator circuitry to perform a modulo-31 check to avoid errors. The construction of VCO 30 according to this embodiment of the invention, by providing an even number of outputs from an even number of stages, avoids the necessity for this modulo-31 check, and thus facilitates simpler downstream circuitry.

Referring back to FIG. 4, the operation of PLL 25 follows that of conventional PLLs, such that the multiple-phase outputs from VCO 30 are at a frequency that is adjusted so that the feedback clock on line CFB becomes phase-synchronous with the reference clock CREF. After a sufficient number of cycles, and assuming a relatively stable reference clock CREF, the periodic clocks generated by VCO 30 will be locked onto the reference clock CREF, providing stable operation.

In the example of FIG. 3, in which clock generation circuit 22 is implemented within video decoder 80, the frequency of the clock signal on line CREF, generated from the sync pulses within the video input channels CH1, CH2, may be expected to fall within a relatively small range. In this case, the locking of PLL 25 may be assisted by an initialization clock circuit that generates a clock signal, for example based upon external crystal 23, that is at a nominal frequency corresponding to the frequency expected from the video input signals; this clock signal may be initially applied to line CFB (by way of a control gate, not shown) so that the operation of PLL 25 may rapidly lock onto the reference clock on line CREF.

Clock generation circuit 22 according to this preferred embodiment of the invention also includes one or more instances of frequency synthesis circuit 27. As will be described in further detail below, each frequency synthesis circuit 27 receives the multiple phases of the clock signal generated by PLL 25 and generates a corresponding clock signal at its output COUT. The frequency of the output clock signal on line COUT from frequency synthesis circuit 27 is set by the digital value applied on corresponding input lines $FREQ_i$ to frequency synthesis circuit 27, generated by control logic of the integrated circuit or system within which clock generation circuit 22 is implemented. The digital value on lines $FREQ_i$ corresponds, in the preferred embodiments of the present invention, to a multiple of the frequency of the clock signal generated by PLL 25. As will become evident from the following description, the number of lines FREQ applied to frequency synthesis circuit 27 is greater than the number required to uniquely select individual phases of the output of PLL 25; in other words, if m phases are generated by PLL 25 in each cycle of its output clock, the number of lines FREQ is greater than $\log_2 m$. This enables additional precision in the selection of the time-averaged frequency of the output clock signal on line COUT, while ensuring minimal phase drift, as will be described below.

As shown in FIG. 4, multiple frequency and phase synthesis circuits 27 may be implemented within clock generation circuit 22, for generating multiple output clock signals at independently selectable frequencies and phases, based upon the output from a single PLL 25. The generation of such multiple independently selectable frequencies is particularly useful in applications such as video decoder 80 described hereinabove, where a single clock generation circuit 22 provides synchronized clock signals to multiple circuit functions, each of which may require a different clock frequency. In the arrangement of FIG. 4, PLL 25 applies its multiple phases (numbering m) of a single frequency output signal to each of multiple frequency and phase synthesis circuits $27_0$ through $27_k$. Each of frequency and phase synthesis circuits $27_0$ through $27_k$ receive independent frequency select inputs on corresponding sets of input lines $FREQ_0$ through $FREQ_k$, responsive to which the frequency of the respective output clock signals $COUT_0$ through $COUT_k$ relative to the frequency output by PLL 25 may be set. Of course, the numbers of lines FREQ received by each of frequency and phase synthesis circuits 27 need not all be alike; indeed, not all of the frequency and phase synthesis circuits $27_0$ through $27_k$ need receive full precision selection inputs, as the clock frequencies necessary for some circuit functions may not require full precision. As will be apparent from the following description, however, because the additional circuitry required to provide the improved precision according to the preferred embodiment of the invention is relatively modest, it is contemplated that all frequency and phase synthesis circuits $27_0$ through $27_k$ will be constructed to utilize the full precision input.

Figure 6:
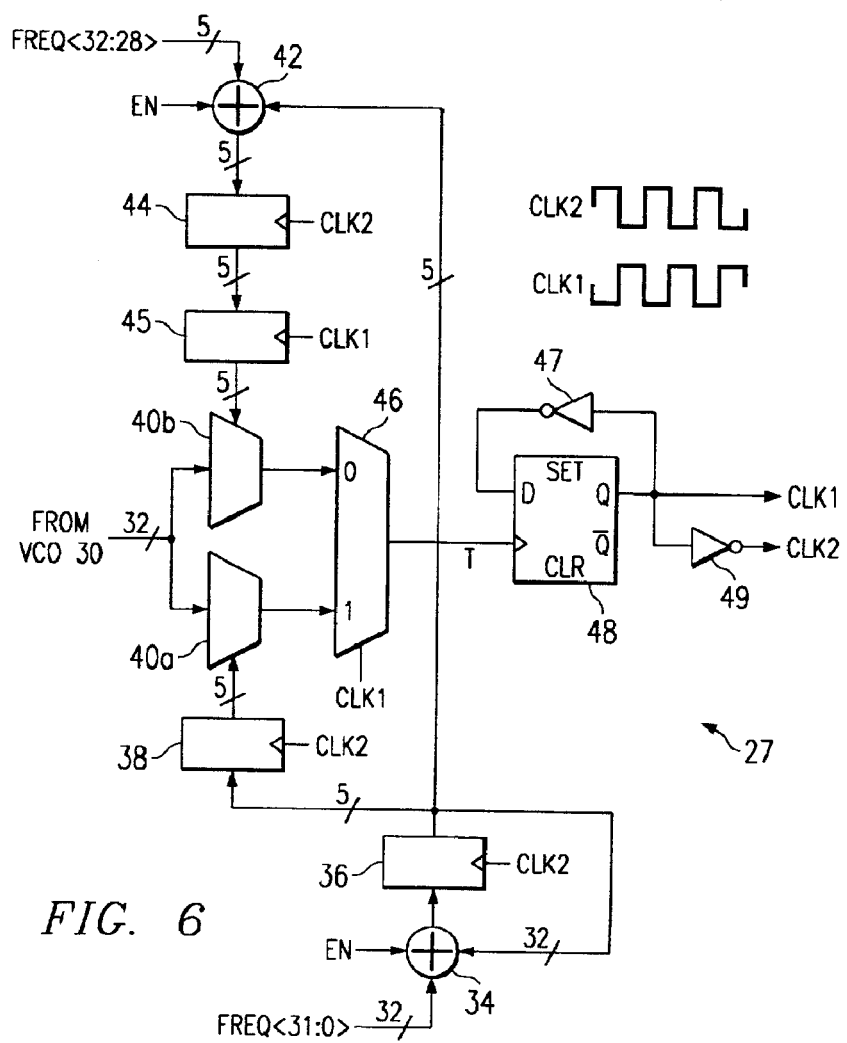
FIG. 6 is an electrical diagram, in block form, of a clock synthesis circuit according to a first preferred embodiment of the invention.

Referring now to FIG. 6 the construction of frequency synthesis circuit 27 according to a first preferred embodiment of the invention will now be described. It is contemplated that, in the case where multiple frequency and phase synthesis circuits 27 are used such as is shown in FIG. 4, each of the frequency and phase synthesis circuits 27 will be similarly constructed.

According to this embodiment of the invention, the clock phases from VCO 30 are applied to inputs of multiplexers 40a, 40b. Multiplexers 40a, 40b are m-to-one multiplexers, for selecting an input for forwarding to its output responsive to the digital value applied to its select input. In this example, multiplexers 40a, 40b select one of thirty-two clock phases from VCO 30 for application to their respective outputs, responsive to five-bit values at their inputs from registers 38, 45, respectively. The outputs of multiplexers 40a, 40b are connected to inputs of two-to-one multiplexer 46.

Multiplexer 46 selects between the outputs of multiplexers 40a, 40b, in response to clock signal CLK1. The output of multiplexer 46 in turn is connected to the clock input of D-type flip-flop 48. Flip-flop 48, which is a conventional D-type bistable multivibrator, is configured in toggle fashion, and as such has its Q output connected to its D input via inverter 47, so that each rising edge received at its clock input from multiplexer 46 causes flip-flop 48 to toggle its Q output. The Q output drives clock signal CLK1, and drives clock signal CLK2 via inverter 49. Clock signals CLK1, CLK2 are therefore complementary to one another, as shown in FIG. 6. Alternatively, if flip-flop 48 includes an inverting output ($\overline{Q}$), this inverting output could directly generate clock signal CLK2 and also be connected to the D input. With respect to FIG. 4, the output clock signal COUT corresponds to one (or both) of clock signals CLK1, CLK2.

According to this embodiment of the invention, the phase selection by multiplexers 40a, 40b, is effected by two adder legs. The construction of these legs will be described in connection with this example in which a five-bit digital word selects one of thirty-two clock phases; of course, a different number of available clock phases will be selected by a digital word of different size ($\log_2 m$, for m available phases).

A first leg includes adder 34, which receives, at one input, a thirty-two bit value on lines FREQ <31:0> that selects the desired output clock phases. As described in copending and commonly assigned application Ser. No. 09/472,268, filed Dec. 27, 1999, incorporated herein by reference, the frequency of the output clock signal on lines CLK1, CLK2 is set by the digital value on lines FREQ, generally from control logic of the integrated circuit or system within which clock generation circuit 22 is implemented. The digital value on lines FREQ corresponds, in the preferred embodiments of the present invention, to the number of clock phases that are to elapse between transitions of clock signal CLK1, CLK2, and in this sense corresponds to a multiple of the output frequency of PLL 25. As will become evident from the following description, the number of lines FREQ applied to frequency synthesis circuit 27 is greater than the number required to uniquely select individual phases of the output of PLL 25; in other words, if m phases are generated by PLL 25 in each cycle of its output clock, the number of lines FREQ is greater than $\log_2 m$. This enables additional precision in the selection of the time-averaged frequency of the output clock signal on lines CLK1, CLK2.

The second input to adder 34 is a thirty-two bit value from register 36, which is the register receiving the sum generated by adder 34 itself. In this manner, when enabled by enable signal EN, adder 34 adds the digital value on lines FREQ<31:0> to its most recent sum, as stored in register 36 upon receiving a rising edge from output clock signal CLK2. Besides the thirty-two bit contents of register 36 being applied back to adder 34 (and to adder 42 in the other leg, as will be described below), the five most significant bits of the contents of register 36 are stored in register 38 on the next rising edge of output clock CLK2. These five bits, corresponding to the integer portion of the thirty-two bit sum, are then applied by register 38 to the select inputs of multiplexer 40a.

The second leg of frequency synthesis circuit 27 includes adder 42, which receives a five bit digital value on lines FREQ<32:28> at one input. As indicated by the bit assignment, adder 42 receives one more-significant bit on lines FREQ than does adder 34. The five-bit integer portion of the contents of register 36 is applied to the second input of adder 42. When enabled by enable signal EN, adder 42 sums these two values, with the sum stored in register 44 upon a rising edge of output clock signal CLK2. The contents of register 44 are then clocked into register 45 on the next rising edge of output clock signal CLK1. The contents of register 45 are then presented to the select input of multiplexer 40b.

In this embodiment of the invention, multiplexer 46 is controlled by output clock signal CLK1, so that the output of multiplexer 40b is forwarded responsive to output clock signal CLK1 being low ("0") and the output of multiplexer 40a is forwarded responsive to output clock signal CLK1 being high ("1").

In operation, the thirty-three bit digital word selecting the output frequency of output clock signals CLK1, CLK2 are applied to lines FREQ <32:0>. Assuming enabling (line EN active), adders 34, 42 add their corresponding bits of lines FREQ with the previous contents of register 36. Upon the next rising edge of output clock signal CLK2, the sums produced by adders 34, 42 are stored in registers 36, 44, respectively. The contents of register 44 then propagate to register 45. Also at this time, the integer portion of the contents of register 36 propagates to the input of register 38, and the full contents of register 36 are forwarded to adder 34 in preparation for the next sum, and the most significant five-bit portion of register 36 is forwarded to adder 42. Upon the first rising edge of output clock signal CLK1, the contents of register 45 propagate to the select input of multiplexer 40b. Conversely, upon the next rising edge of output clock signal CLK2, the integer portion of the contents of register 36 are stored in register 38; of course, this clock edge also clocks the next sums from adders 34,42 into registers 36,44.

Once the registers have been loaded in this fashion, succeeding clock edges of output clock signals CLK1, CLK2 also control the generation of the next cycles of these output clock signals. Between a rising edge of output clock signal CLK1 and a rising edge of output clock signal CLK2, multiplexer 46 forwards the clock phase selected by multiplexer 40a to the clock input of flip-flop 48; this selected clock phase, when it occurs, will toggle flip-flop 48, causing a falling edge of output clock signal CLK1 and a rising edge of output clock signal CLK2. The rising edge of output clock signal CLK2 (and corresponding falling edge of output clock signal CLK1) causes multiplexer 46 to forward the output of multiplexer 40b, and thus the clock phase selected by register 45, to be applied to the clock input of flip-flop 48. Once this clock edge occurs, output clock signals CLK1, CLK2 make another transition.

During such time as output clock signal CLK1 is high and output clock signal CLK2 is low, as noted above, multiplexer 46 is applying the output of multiplexer 40a to flip-flop 48, and also the contents of register 44 is clocked into and propagating to the output of register 45 and thus to the select input of multiplexer 40b in preparation for the falling edge of clock signal CLK1. Similarly, during such time as output clock signal CLK1 is low and output clock signal CLK2 is high, multiplexer 46 is applying the output of multiplexer 40b to flip-flop 48, and the integer portion of the contents of register 36 is clocked into and propagating to the output of register 38 and thus to the select input of multiplexer 40a in preparation for the next rising edge of clock signal CLK1. In this manner, the select value for the next half cycle of the output clock signals CLK1, CLK2 is propagating to its corresponding one of multiplexers 40 during the time that the other multiplexer 40 is selected by multiplexer 46.

Figure 1:
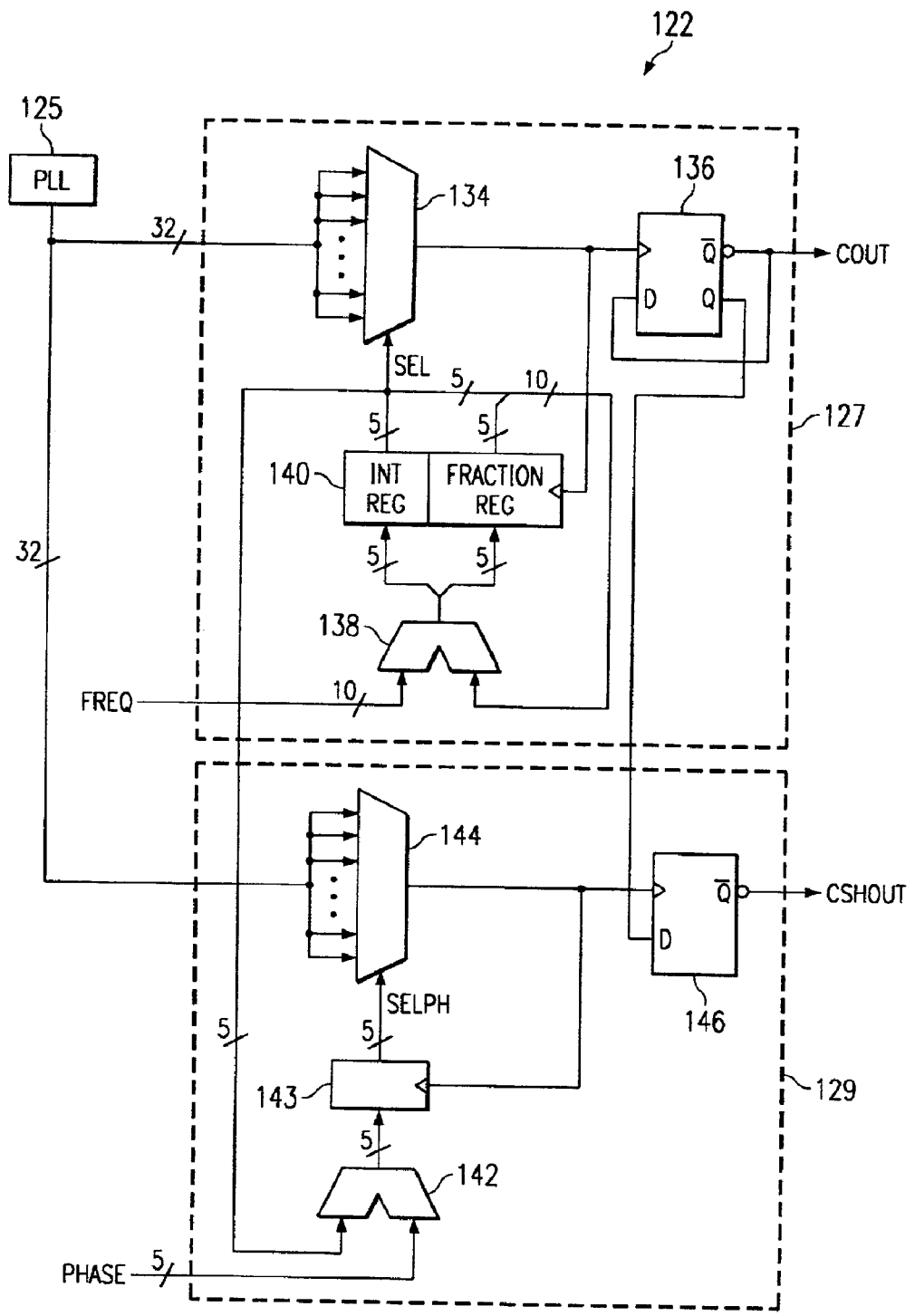
FIG. 1 is an electrical diagram, in schematic form, of a clock and phase synthesis circuit according to the prior art.
Figure 2:
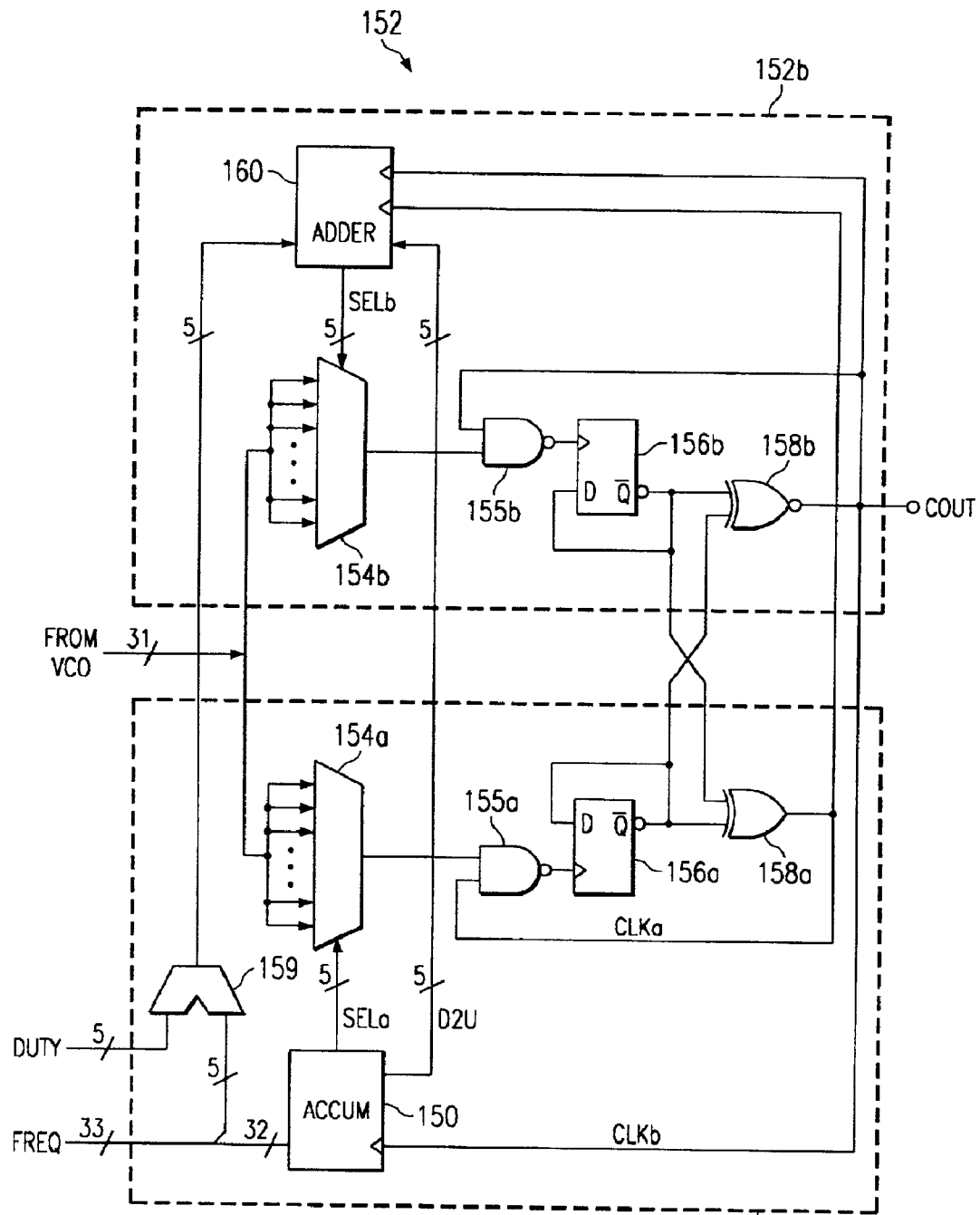
FIG. 2 is an electrical diagram, in schematic form, of another clock synthesis circuit according to the prior art.

According to this first preferred embodiment of the invention, therefore, the propagation delay constraints of frequency synthesis circuit 27 are much relaxed from that of conventional circuits, including those shown in FIGS. 1 and 2 and discussed above. In contrast to the circuit of FIG. 2 in which the propagation delays of gate 155a, flip-flop 156a, and exclusive-OR gate 158a (or gate 155b, flip-flop 156b, and gate 158b), in this embodiment of the invention timing is satisfied only by the propagation of data through multiplexer 46 and flip-flop 48 during a half-cycle of the output clock signals CLK1, CLK2. The propagation of data through adders 34, 42, and registers 36, 44 can occur within a single full clock cycle of output clock signal CLK2 because of the pipelined operation. As a result, the frequency of operation of frequency synthesis circuit 27 can be increased to a much higher rate, for the same device technology, from that of prior circuits.

Secondly, a double-frequency output clock is generated by frequency synthesis circuit 27 according to this invention. Node T at the output of multiplexer 46, and at the input of flip-flop 48, is switching at twice the frequency of output clock signals CLK1, CLK2, considering that each rising edge of node T causes a transition (alternately rising and falling) of output clock signals CLK1, CLK2. This double-frequency signal may be useful in some applications.

Furthermore, frequency synthesis circuit 27 of this first preferred embodiment of the invention is not vulnerable to multiplexer glitches, as is the case in conventional circuits such as shown in FIG. 1. During such time as multiple-bit select signals are being applied to one of multiplexers 40a, 40b, and thus during such time as the output of that multiplexer 40a, 40b may be unstable, multiplexer 46 is selecting the other one of multiplexers 40a, 40b, preventing any possible glitch from appearing at flip-flop 48.

Figure 7:
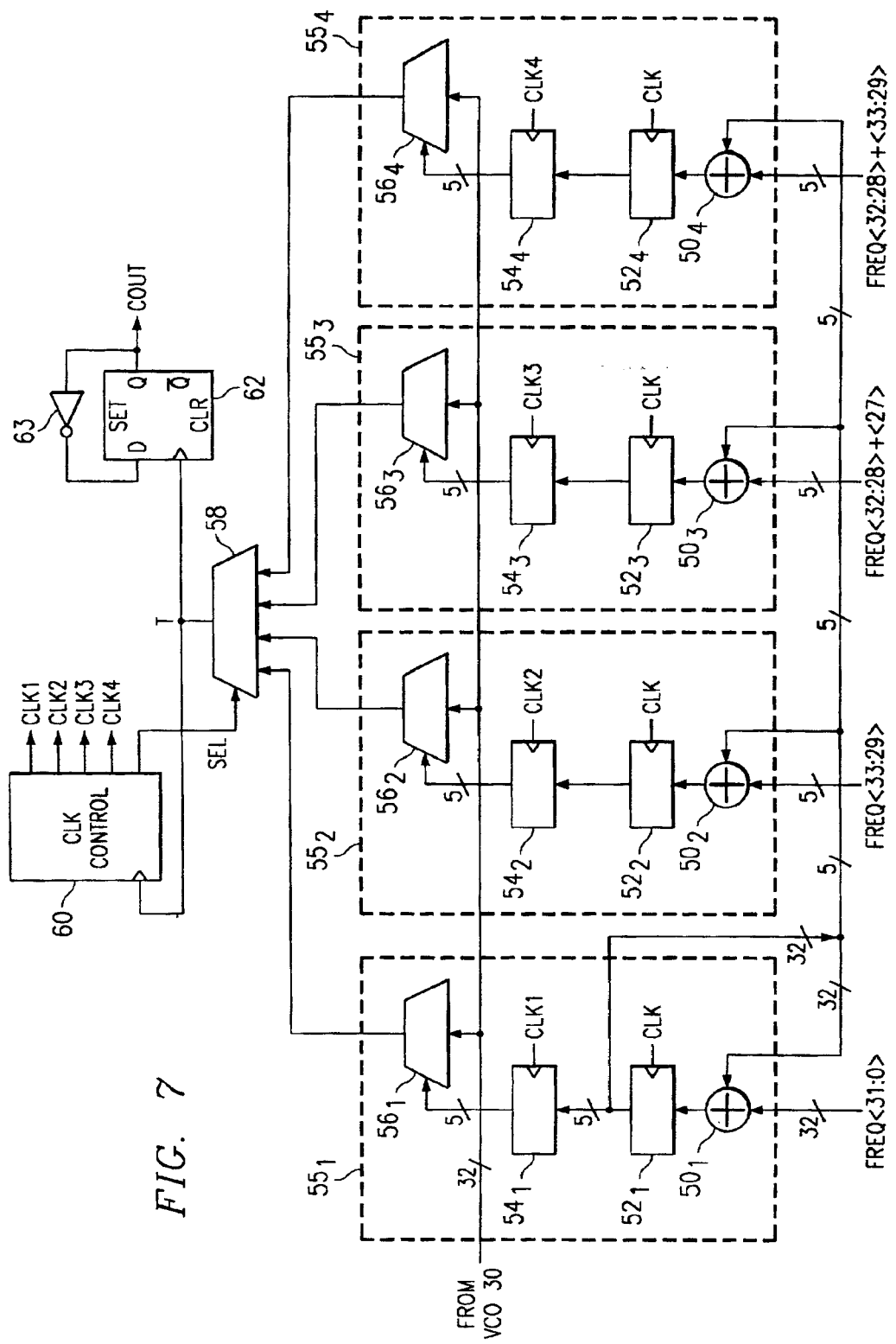
FIG. 7 is an electrical diagram, in block form, of a clock synthesis circuit according to a second preferred embodiment of the invention.

In addition to these advantages of this architecture, this invention provides the ability to readily scale the generation of clock signals to achieve additional performance for a given technology and propagation delay. Referring now to FIG. 7, the construction of frequency synthesis circuit 77 according to a second preferred embodiment of this invention will now be described in detail. Frequency synthesis circuit 77 can be substituted for one or more of frequency synthesis circuits 27 in clock generation circuit 22 of FIG. 4. As will become apparent from this description, an arbitrary number of adder and register units may be used to toggle successive edges of an output flip-flop, providing additional timing room for the selection of PLL clock phases.

In the example of FIG. 7, frequency synthesis circuit 77 includes four adder and register units $55_1$ through $55_4$. Adder and register unit $55_1$ includes adder $50_1$, which receives a thirty-two bit value on lines FREQ <31:0> for selecting one desired output clock phase at one input. The output of adder $50_1$ is applied to thirty-two-bit register $52_1$; the contents of register $52_1$ are fed back to a second input of adder $50_1$. As a result, adder $50_1$ accumulates the current value on lines FREQ <31:0> from iteration to iteration. Register $52_1$ stores an integer portion and a fraction portion of the accumulated selection value. The integer portion, for example the five most significant bits when selecting from thirty-two clock phases, is stored in register $54_1$ on a rising edge of a clock signal CLK1. The output of register $54_1$ is applied to the select input of multiplexer $56_1$, which receives the multiple clock phases (e.g., thirty-two in number) from VCO 30 at its input. In response to the value stored in register $54_1$. multiplexer $56_1$ selects one of the available clock phases from VCO 30 for application to an input of multiplexer 58.

Adder and register units $55_2$, $55_3$, and $55_4$ are constructed similarly as one another. With reference to adder and register unit $55_2$, by way of example, five-bit adder $50_2$ adds a five-bit portion of the selection value on lines FREQ to the most significant five bits of the feedback value from register $52_1$ of adder and register unit $55_1$. In this way, the integer portion of the accumulated sum of register $52_1$ is included in the addition performed by adder $50_2$, as discussed above. The five-bit sum from adder $50_2$ is stored in register $52_2$, and then clocked into register $54_2$ by a rising edge of clock signal CLK2. This value is applied to the select input of multiplexer $56_2$, to select one of the available clock phases from VCO 30 for application to a corresponding input of multiplexer 58.

Adder and register units $55_3$ and $55_4$ are constructed similarly as adder and register unit $55_2$. Adder and register units $55_2$ through $55_4$ differ from one another in the particular five bits of lines FREQ that are applied to their respective adders $50_2$ through $50_4$, and in the clock signal CLK2, CLK3, CLK4 that clocks the storing of the sum in their registers $54_2$ through $54_4$, respectively. In this example, adder $50_3$ adds the sum of lines FREQ<32:28> to the value on line FREQ<27> (by another adder, not shown), and adds this five-bit sum to the feedback value from register $52_1$; similarly, adder $50_4$ adds the sum of lines FREQ<32:28> and FREQ<33:29> to the five-bit feedback value. In this way, adder and register units $55_1$ through $55_4$ will select different ones of the clock phases from VCO 30 for application to multiplexer 58.

Multiplexer 58 selects one of the clock signals at its inputs for application to the clock input of D-type flip-flop 62. Flip-flop 62 is configured in toggle fashion, having its Q output connected to the D input via inverter 63. The output of frequency synthesis circuit 77, on line COUT, is generated at the Q output of flip-flop 62; of course, a complementary clock signal is generated at the inverting output ($\overline{Q}$) of flip-flop 62 and may also be used by a system function. Multiplexer 58 selects one of its inputs to be forwarded to its output in response to a selection signal received from clock control circuit 60. Clock control circuit 60 selects the outputs of multiplexers $56_1$ through $56_4$ in sequence, and generates clock signals CLK1 through CLK4, in sequence as will be described below. The output of multiplexer 58 is also applied to the clock input of clock control circuit 60.

In its general operation, each of adder and register units $55_1$ through $55_4$ select a desired one of the clock phases from VCO 30 according to the sum of its corresponding adder 50. During such time as multiplexer 58 is controlled to select the output of each adder and register unit 55, a rising edge of the selected clock phase from VCO 30 passes through multiplexers 56 and 58 to node T, at the clock input of flip-flop 62, effecting a transition of the clock signal at the output of flip-flop 62. In addition, this rising edge is also coupled to the clock input of clock control circuit 60, advancing the selection value applied to multiplexer 58 and causing a transition of the next clock signal in the sequence of clocks CLK1 through CLK4.

The sequence of the select signal from clock control circuit 60 and the sequence of clock signals CLK1 through CLK4 is arranged so that the timing of the adder and register units 55 can be relatively relaxed relative to the frequency of the output clock signal, as will now be described relative to FIG. 8 in combination with FIG. 7. Prior to the selection of the specific clock phase from VCO 30, each of adders 50 sums its inputs, and stores the result in its corresponding register 52 responsive to a clock signal on line CLK. Clock signal CLK can be any one of clock signals CLK1 through CLK4, so long as the result of the corresponding adder 50 is stored in register 52 each cycle.

Figure 8:
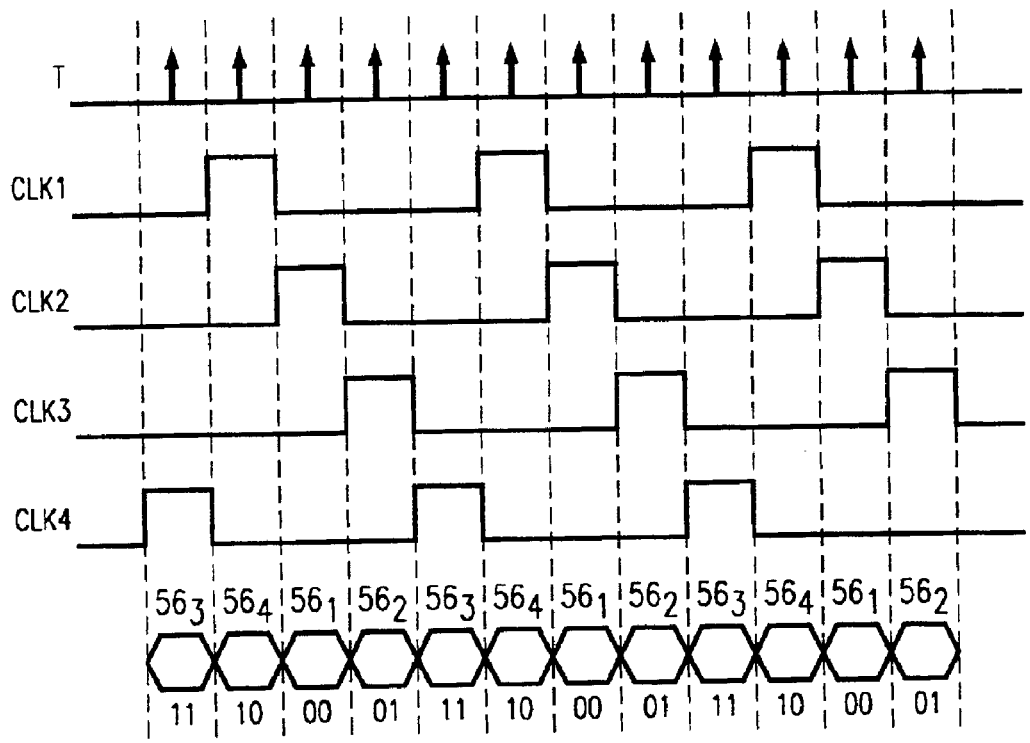
FIG. 8 is a timing diagram illustrating the operation of the clock synthesis circuit according to the second preferred embodiment of the invention.

The timing diagram of FIG. 8 illustrates that, in this example, a rising edge of one of clock signals CLK1 through CL4 occurs every one-fourth of the period of the sequence. During each quarter-cycle, one of clock signals CLK1 through CLK4 is driven active and the others are or become inactive; also during each quarter-cycle, one of the multiplexers $56_1$ through $56_4$ is selected by clock control circuit 60, by way of its select input that is applied to multiplexer 58. As noted above, a rising edge of a selected clock phase from VCO 30 is forwarded to the clock input of flip-flop 62 during each quarter-cycle, and toggles flip-flop 62 as indicated on line T of FIG. 8.

According to this embodiment of the invention, as shown in FIG. 8, each adder unit $55_1$ through $55_4$ is responsible for one input to multiplexer 58, the output of which, as described above, triggers flip-flop 62 from node T. In response to a rising edge of one of clocks CLK1 through CLK4, the select signal to its multiplexer $56_1$ through $56_4$ is updated as the contents of the clocked register $54_1$ through $54_4$ propagates to the control input of its corresponding multiplexer $56_1$ through $56_4$. This rising clock edge of CLK1 through CLK4 occurs a quarter-cycle preceding clock control circuit 60 advancing the value on lines SEL to select its multiplexer $56_1$ through $56_4$, respectively; the timing of the falling edge of clocks CLK1 through CLK4 is not critical. The quarter-cycle time lag between the clocking of register 54 and the selection, by clock control circuit 60, of its corresponding multiplexer 56 ensures that its multiplexer 56 has time to fully decode its select value by the time that multiplexer 58 selects its output for coupling to the clock input of flip-flop 62. The inputs to multiplexer 58 will therefore not see any glitches. In addition, according to this example, each adder and register unit 55 is responsible only for one transition in every two cycles of clock signal COUT. Each adder and register unit 55 thus has up to two full cycles of output clock COUT to add and propagate its signal to the input of its corresponding register 54. Because of this relaxation in the timing requirements, the output clock frequency is increased for the same adder performance.

Further, this construction and operation of frequency synthesis circuit 77 according to this embodiment of the invention permits scalability, considering that an arbitrary number of adder and register units can be implemented by applying the output of each such unit to an input of a multiplexer, and then selecting among these outputs in a sequence corresponding to a sequence of clocks that operate a final register stage in the adder and register units. In addition, the clock signal at node T is at twice the frequency of clock signal COUT, and can be used for high frequency applications in the integrated circuit if desired.

It is understood that the final multiplexer (e.g., four-to-one multiplexer 58 in FIG. 7) is not necessarily a two-to-one multiplexer according to this embodiment of the invention. However, according to this preferred embodiment of the invention, the select values on lines SEL applied to multiplexer 58 by clock control circuit 60 advance according to a Gray code sequence, in which only one bit changes state when advancing in the sequence. As shown in the example of FIG. 8, the select lines advance in the sequence (00, 01, 11, 10.) to select adder units $55_1$ through $55_4$ in sequence, respectively. Because no intermediate states are possible when only one bit changes state, the operation of multiplexer 58 is glitch-free.

According to a third preferred embodiment, the improved architecture of this invention can be used to produce both a primary clock output and a phase-shifted version, as will now be described relative to FIGS. 9a through 9c. According to this embodiment of the invention, the combination of primary frequency synthesis circuit 227 and phase-shift frequency synthesis circuit 327 shown in FIG. 9a can be substituted for one or more of frequency synthesis circuits 27 in clock generation circuit 22 of FIG. 4.

Figure 9A:
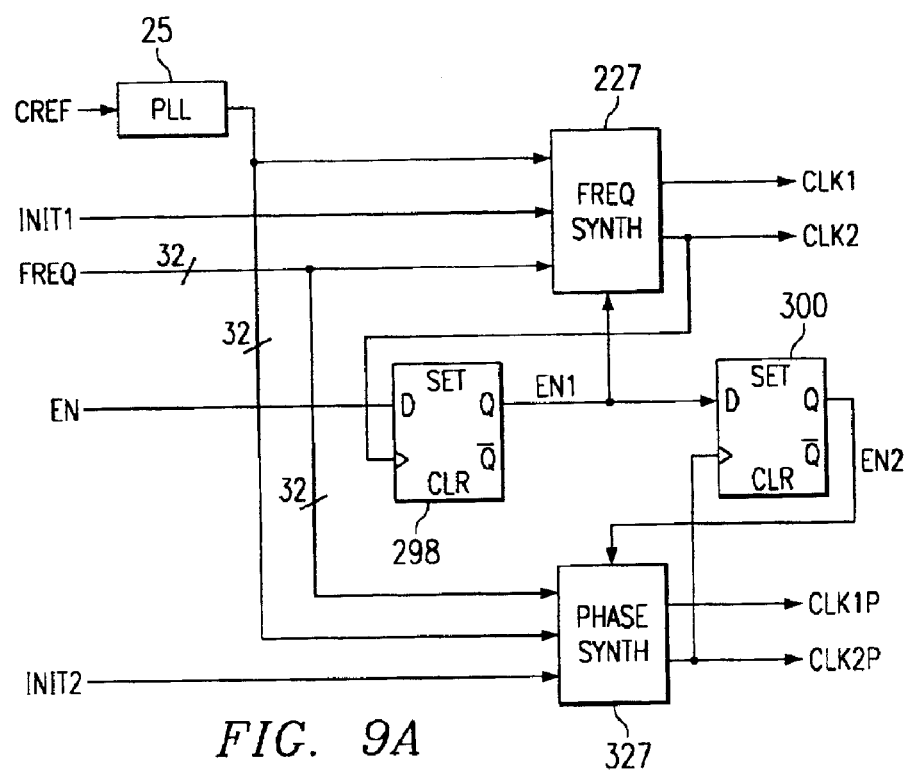
FIGS. 9a through 9c are electrical diagrams, in block form, of a clock synthesis circuit according to a third preferred embodiment of the invention.

FIG. 9a illustrates the overall architecture in which PLL 25 generates multiple clock phases, for example thirty-two clock phases, which are applied to primary frequency synthesis circuit 227 and phase-shift frequency synthesis circuit 327. Each of frequency synthesis circuits 227, 327 receive a digital frequency selection signal on lines FREQ, including both an integer portion and a fractional portion as described above. As shown in FIG. 9a, a general enable signal is provided on line EN. Line EN is applied to the D input of flip-flop 298, which is clocked by clock signal CLK2 from the output of primary frequency synthesis circuit 227, and which produces enable signal EN1 at its Q output. Line EN1 is applied to the D input of flip-flop 300, which is clocked by clock signal CLK2P from the output of phase shift frequency synthesis circuit 327, to produce enable signal EN2 at its Q output. Primary frequency synthesis circuit 227 is enabled by an enable signal on line EN1, and generates complementary clock output signals on lines CLK1, CLK2, one (or both) of which corresponds to the output clock signal COUT (FIG. 4). Phase shift frequency synthesis circuit 327 is enabled by an enable signal on line EN2. In this manner, phase-shift frequency synthesis circuit 327 is not enabled until primary frequency synthesis circuit 227 has generated at least one pulse on lines CLK1, CLK2 after it has been enabled. As will become apparent from the following description, frequency synthesis circuit 227 and phase-shift frequency synthesis circuit 327 operate in an initializing mode, and generate signals at their outputs at a reduced frequency when not enabled by their respective enable signals EN1, EN2.

In this embodiment of the invention, primary frequency synthesis circuit 227 receives initialization value INIT1, and phase-shift frequency synthesis circuit 327 receives initialization value INIT2. As will also be apparent from this description, the difference between initialization values INIT2, INIT1 determines the phase shift between phase-shifted output clock signal CLK1P and primary output clock signal CLK1.

Figure 9B:
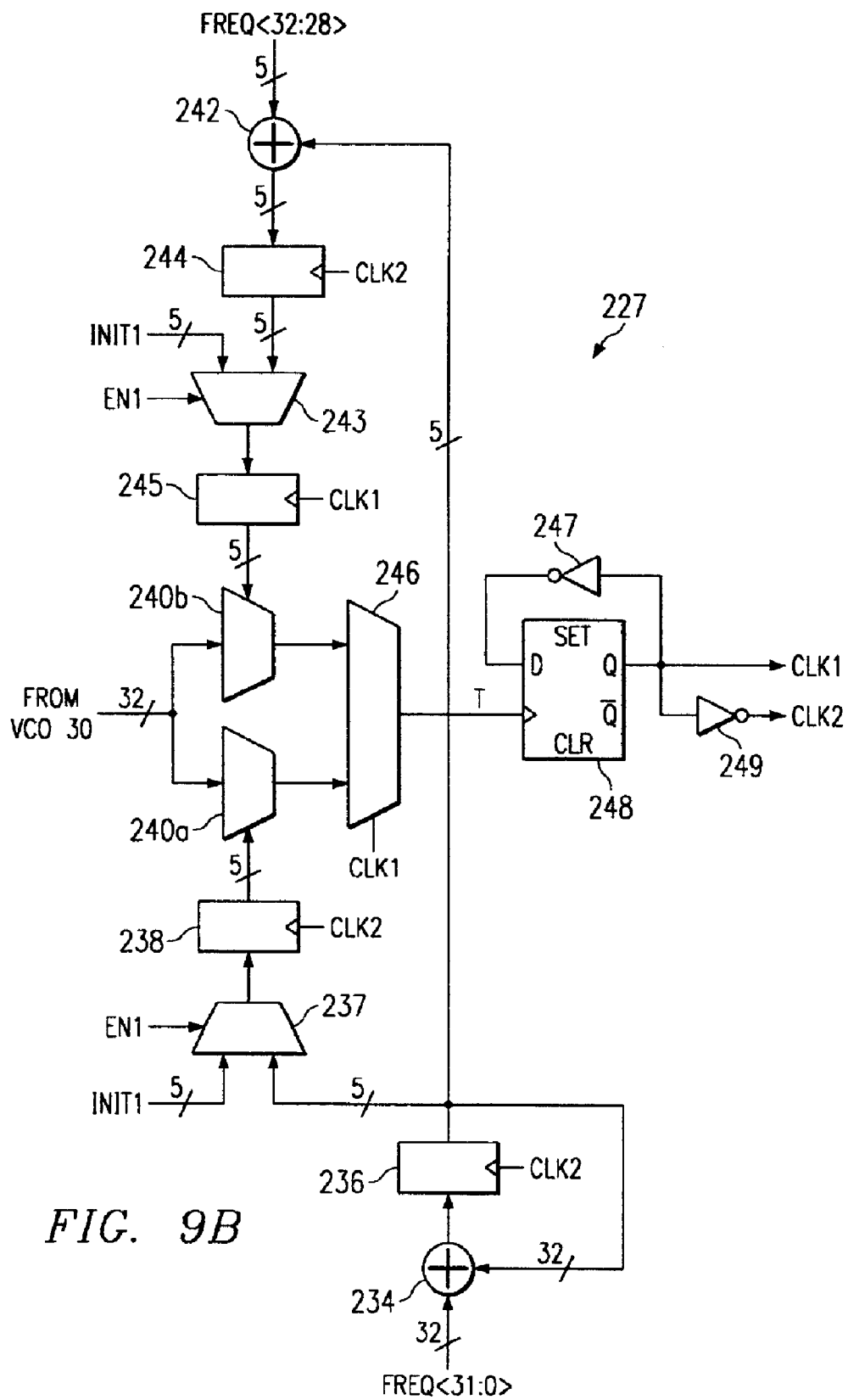

Referring now to FIG. 9b, the construction of primary frequency synthesis circuit 227 will now be described in detail. As evident from FIG. 9b, this construction is substantially similar to that described above for frequency synthesis circuit 27 of FIG. 6. As such, the clock phases from VCO 30 are applied to inputs of multiplexers 240a, 240b, which are thirty-two-to-one multiplexers for selecting according to the digital value applied by registers 245, 238, respectively. The outputs of multiplexers 240a, 240b are connected to two-to-one multiplexer 246, which selects between the outputs of multiplexers 240a, 240b, in response to clock signal CLK1. The output of multiplexer 246 in turn is connected to the clock input of D-type flip-flop 248, configured in toggle fashion via inverter 247, and driving clock signal CLK1 from its Q output and clock signal CLK2 via inverter 49.

According to this embodiment of the invention, the phase selection by multiplexers 240a, 240b, is again effected by two adder legs. The first leg includes adder 234, which adds the thirty-two bit value on lines FREQ <31:0> with the thirty-two bit value from register 236, which is the register receiving (with clock signal CLK2) the sum generated by adder 234 itself. The five most significant bits of the contents of register 236 are applied to one input of multiplexer 237, which receives the initialization value INIT1 at its other input. Multiplexer 237 selects initialization value INIT1 when enable signal EN1 is inactive, and selects the output of register 236 when enable signal EN1 is active. The selected value at the output of multiplexer 237 is applied to register 238 for storage on the next rising edge of output clock CLK2, and then applied to the select inputs of multiplexer 240a.

The second leg of frequency synthesis circuit 227 includes adder 242, which receives a five bit digital value on lines FREQ<32:28> at one input, and the five-bit integer portion of the contents of register 236 at its second input. Adder 242 sums these two values, and applies the sum to one input of multiplexer 243. Multiplexer 243 also receives initialization value INIT1 at a second input. Multiplexer 243 selects initialization value INIT1 when enable signal EN1 is inactive, and selects the output of register 244 when enabled by enable signal EN1. The value presented at the output of multiplexer 243 is stored in register 244 with a rising edge of output clock signal CLK2, and is clocked into register 245 on the next rising edge of output clock signal CLK1. The output of register 245 is presented to the select input of multiplexer 240b.

In this embodiment of the invention, as before, multiplexer 246 is controlled by output clock signal CLK1, so that the output of multiplexer 240a is forwarded to the clock input of flip-flop 248 responsive to output clock signal CLK1 being high ("1") and so that the output of multiplexer 240b is forwarded responsive to output clock signal CLK1 being low ("0"). Clock signals CLK1, CLK2 are produced by flip-flop 248 as before.

Primary frequency synthesis circuit 227 operates in substantially the same fashion as frequency synthesis circuit 27 described above relative to FIG. 6. The particular clock phases that are selected by primary frequency synthesis circuit 227 are initialized by initialization value INIT1 in primary frequency synthesis circuit 227, however, through the operation of multiplexers 237, 243. During such time as primary frequency synthesis circuit 227 is not enabled (line EN1 inactive), the clock phases indicated by initialization value INIT1 will be selected by multiplexers 240a, 240b, thus toggling flip-flop 248 to generate clock signals CLK1, CLK2 at one-half the frequency of VCO 30. Once primary frequency synthesis circuit 227 is enabled, the clock phases are selected by the accumulation of the selection value on lines FREQ in the manner described above.

Figure 9C:
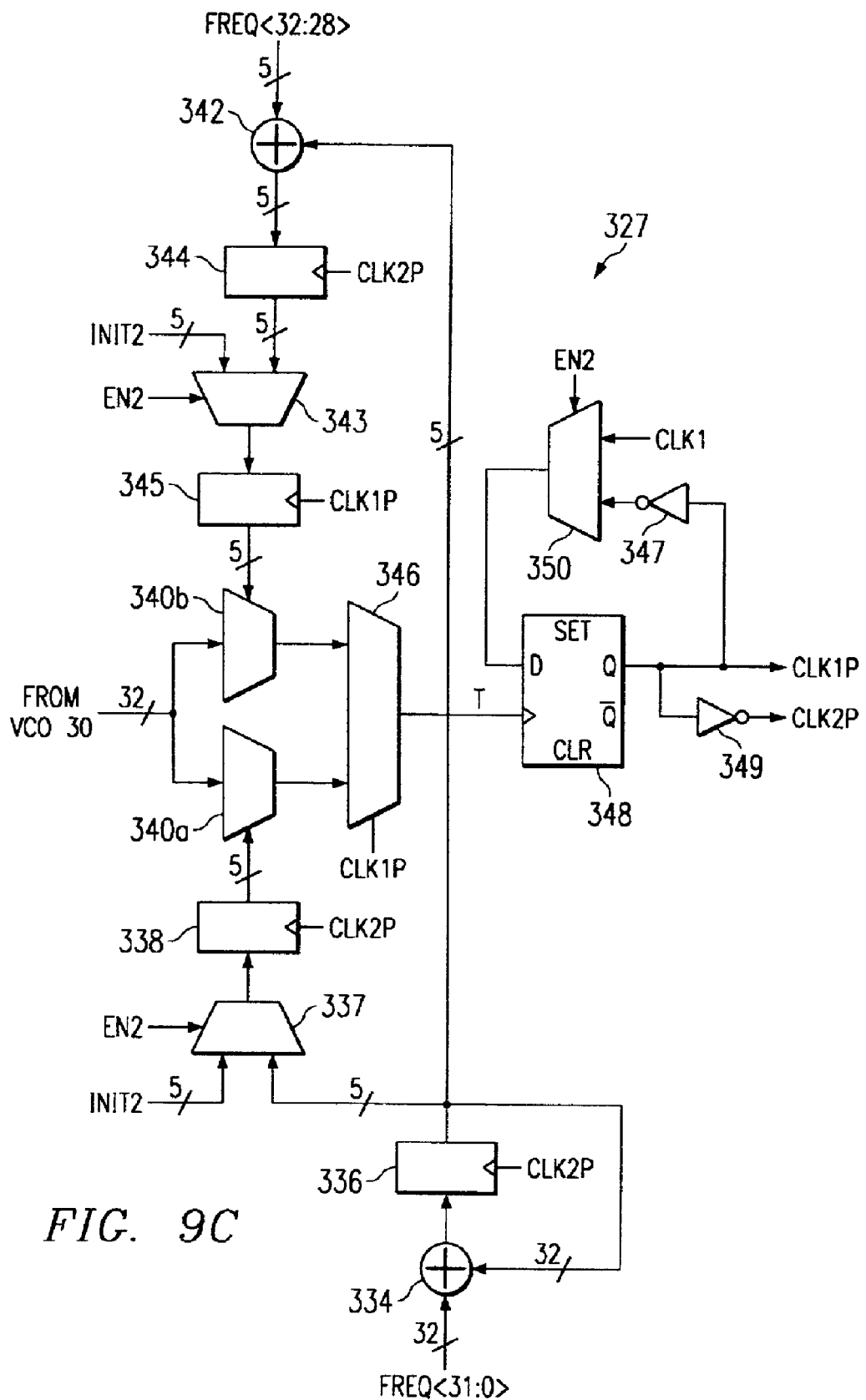

Phase-shift frequency synthesis circuit 327 is constructed similarly as primary frequency synthesis circuit 227, as shown in FIG. 9c. The clock phases from VCO 30 are applied to inputs of multiplexers 340a, 340b, which are thirty-two-to-one multiplexers for selecting a PLL phase according to the digital value applied by registers 345,338, respectively. The outputs of multiplexers 340a, 340b are connected to inputs of two-to-one multiplexer 346, which selects between the outputs of multiplexers 340a, 340b, in response to clock signal CLK1P. The output of multiplexer 346 in turn is connected to the clock input of D-type flip-flop 348, configured in toggle fashion, driving clock signal CLK1P from its Q output. Complementary clock signal CLK2P is generated from inverter 349 (or alternatively from the $\overline{Q}$ output of flip-flop 348, if desired).

The toggle configuration of flip-flop 348 is implemented, in this example, by inverter 347 having its input connected to the Q output of flip-flop 348, and having its output applied to one input of multiplexer 350. Clock signal CLK1 from primary frequency synthesis circuit 227 is applied to a second input of multiplexer 350, and multiplexer 350 is controlled by enable signal EN2. The output of multiplexer 350 is applied to the D input of flip-flop 348. Multiplexer 350 selects clock signal CLK1 when enable line EN2 is inactive, ensuring that phase-shifted clock signal CLK1P lags (rather than leads) clock signal CLK1. Once enabled by line EN2 being active, flip-flop 348 operates in conventional toggle fashion.

According to this embodiment of the invention, the phase selection by multiplexers 340a, 340b, is again effected by two adder legs. In a first leg, adder 334 adds the thirty-two bit value on lines FREQ <31:0> with the thirty-two bit value from register 336 coupled to the output of adder 334, so that adder 334 and register 336 operate as an accumulator. The five most significant bits of the contents of register 336 and initialization value INIT2 are applied to the inputs of multiplexer 337, which selects initialization value INIT2 when enable signal EN2 is inactive, and selects the integer portion of register 336 when enable signal EN2 is active. The value selected by multiplexer 337 is clocked into register 338 by output clock CLK2P, and then forwarded to the select inputs of multiplexer 340a.

In the second leg of phase-shift frequency synthesis circuit 327, adder 342 sums a five bit digital value on lines FREQ<32:28> with the five-bit integer portion of the contents of register 336, and applies the sum to one input of multiplexer 343, which receives initialization value INIT2 at a second input. Multiplexer 343 selects initialization value INIT2 when enable signal EN2 is inactive, and selects the output of register 344 when enable signal EN2 is active. The selected value is clocked into register 344 by clock signal CLK2P, and is then clocked into register 345 by the next rising edge of output clock signal CLK1P. The output of register 345 is presented to the select input of multiplexer 340b.

In operation, referring to FIGS. 9a through 9c in combination, primary and phase-shift frequency synthesis circuits 227, 327 operate in a determinate relationship when not enabled (lines EN1, EN2 inactive). In this state, primary frequency synthesis circuits 227 generates clock signals CLK1, CLK2, at one-half the frequency of VCO 30, based on the clock phase selected by initialization value INIT1. With enable line EN2 inactive, multiplexers 340a, 340b in phase-shift frequency synthesis circuit 327 select the clock phases from VCO 30 indicated by initialization value INIT2, through the operation of multiplexers 337,343. Output clock signal CLK1P selects between the outputs of multiplexer 340a, 340b for application to the clock input of flip-flop 348. Multiplexer 350 is meanwhile selecting output clock signal CLK1 for application to the D input of flip-flop 348, ensuring that a rising edge of phase-shift output clock signal CLK1P will follow a rising edge of output clock signal CLK1. As a result of this construction and operation, therefore, phase-shift clock signal CLK1P will lag output clock signal CLK1 by a phase-shift:

$$(INIT2-INIT1)\Delta$$

where $\Delta$ is the phase difference between adjacent clock phases at the output of VCO 30. This determinate operation of frequency synthesis circuits 227, 327 continues so long as enable line EN1 remains inactive.

Upon enabling of the frequency selection function, by the driving of enable line EN1 active by control circuitry located elsewhere on the integrated circuit containing frequency synthesis circuits 227, 327, primary frequency synthesis circuit 227 will begin generating output clock signal CLK1 at the clock frequency (i.e., the number of clock phases between transitions) selected on lines FREQ, in the manner described above. The active state on enable line EN1 will propagate to enable line EN2 on the next rising edge of complementary output clock signal CLK2, through the operation of flip-flop 300 (FIG. 9a), causing phase-shift frequency synthesis circuit 327 to begin generating phase-shift output clock CLK1P at the same frequency corresponding to the value on lines FREQ, by causing multiplexers 337, 343 to select their corresponding incoming sums for application to multiplexers 340b, 340a, respectively. In addition, because of the operation of multiplexer 350 now selecting phase-shift output clock signal CLK1P for application to the D input of flip-flop 348, the phase difference indicated by (INIT2−INIT1)$\Delta$ is maintained after enabling.

According to this implementation, enable line EN1 (and thus enable line EN2) should be driven inactive prior to making changes in the frequency selection value on lines FREQ. This will ensure that the desired phase-shift between output clock signals CLK1, CLK1P results.

According to this embodiment of the invention, the previously discussed advantages of high-frequency clock generation are obtained, with minimized vulnerability to multiplexer output glitches because the multiplexers toggling the output flip-flop are of two-to-one construction; should this embodiment of the invention be scaled in the manner described above, in which the output multiplexer is of greater than two-to-one construction, glitches are preferably avoided by Gray code sequencing of the select values. Also as discussed above, the benefits of generating a double-frequency clock, and of scalability, can also be attained. This third embodiment of the invention provides the additional advantages of providing a secondary output clock signal that is phase-shifted from a primary clock signal by an amount determined by a digital word. Because of the interlocking of the phase-shifted clock to the primary output clock signal provided by this embodiment of the invention, and because of the operation of these frequency synthesis circuits in a determinate manner upon changing from a disabled to an enabled condition, the available phase shift selection can range from 0° to 360°, with no dead zone present (e.g., near 0°) within which the phase shift cannot be selected, as is present in prior circuits as discussed above. Of course, if only frequency synthesis is required of the circuits according to this embodiment of the invention, initialization into any state will suffice; however, this embodiment of the invention provides determinate initialization when phase synthesis is desired.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A clock generation circuit, comprising:
    a phase-locked loop for generating a plurality of clock phases;
    a first frequency synthesis circuit, comprising:
        a first multiplexer, for forwarding a selected one of the plurality of clock phases responsive to a first select signal;
        a second multiplexer, for forwarding a selected one of the plurality of clock phases responsive to a second select signal;
        a first adder leg, having an input for receiving a frequency select word having an integer portion and a fractional portion, for generating the first select signal corresponding to an accumulation of the frequency select word;
        a second adder leg, having an input for receiving a portion of the frequency select word, for generating the second select signal corresponding to a sum of the portion of the frequency select word with an accumulation of the frequency select word;
        a toggle multiplexer, having first and second inputs coupled to the outputs of the first and second multiplexers, for toggling a selection of its inputs in sequence; and
        a multivibrator, having a clock input coupled to an output of the toggle multiplexer, for inverting an output of the multivibrator responsive to a transition at its clock input.

2. The circuit of claim 1, wherein the first adder leg comprises:
    a first adder, for adding a frequency select value having an integer portion and a fractional portion to a feedback value;
    a first register for storing a sum from the first adder having an integer portion and a fractional portion; and
    a second register, coupled to the first register, for storing the integer portion of the sum, and for presenting its contents to the first multiplexer as the first select signal.

3. The circuit of claim 2, wherein the second adder leg comprises:
    a second adder, for adding a portion of the frequency select value with the contents of the first register;
    a third register, for storing a sum from the second adder; and
    a fourth register, coupled to the third register, for presenting its contents to the second multiplexer as the second select signal.

4. The circuit of claim 1, wherein the select input of the toggle multiplexer is coupled to a first output of the multivibrator.

5. The circuit of claim 4, wherein the multivibrator has a second output that presents a second clock signal complementary to a first clock signal generated at its first output;
    wherein each of the first, second, and third registers are clocked by the second clock signal;
    and wherein the fourth register is clocked by the first clock signal.

6. The circuit of claim 1, further comprising:
- a third multiplexer, for forwarding a selected one of the plurality of clock phases responsive to a third select signal, the third multiplexer having an output coupled to an input of the toggle multiplexer;
- a third adder leg, having an input for receiving a portion of the frequency select word, for generating the third select signal corresponding to a sum of the portion of the frequency select word with an accumulation of the frequency select word; and
- a clock control circuit, for controlling the toggle multiplexer according to a sequence of select signals.

7. The circuit of claim 6, wherein the first adder leg comprises:
- a first adder, for adding a frequency select value having an integer portion and a fractional portion to a feedback value;
- a first register for storing a sum from the first adder having an integer portion and a fractional portion; and
- a second register, coupled to the first register, for storing the integer portion of the sum, and for presenting its contents to the first multiplexer as the first select signal;

wherein the second adder leg comprises:
- a second adder, for adding a portion of the frequency select value with the contents of the first register;
- a third register, for storing a sum from the second adder; and
- a fourth register, coupled to the third register, for presenting its contents to the second multiplexer as the second select signal;

and wherein the third adder leg comprises:
- a third adder, for adding a portion of the frequency select value with the contents of the first register;
- a fifth register, for storing a sum from the third adder; and
- a sixth register, coupled to the fifth register, for presenting its contents to the second multiplexer as the third select signal.

8. The circuit of claim 1, further comprising:
a second frequency synthesis circuit, comprising:
- a first multiplexer, for forwarding a selected one of the plurality of clock phases responsive to a first select signal;
- a second multiplexer, for forwarding a selected one of the plurality of clock phases responsive to a second select signal;
- a first adder leg, having an input for receiving a frequency select word having an integer portion and a fractional portion, for generating the first select signal corresponding to an accumulation of the frequency select word;
- a second adder leg, having an input for receiving a portion of the frequency select word, for generating the second select signal corresponding to a sum of the portion of the frequency select word with an accumulation of the frequency select word;
- a toggle multiplexer, having first and second inputs coupled to the outputs of the first and second multiplexers, for toggling a selection of its inputs in sequence; and
- a multivibrator, having a clock input coupled to an output of the toggle multiplexer, for inverting an output of the multivibrator responsive to a transition at its clock input;

wherein the first and second adder legs of the first frequency synthesis circuit receive a first initialization value, and are enabled by a first enable signal so that, when the first enable signal is inactive, the first frequency synthesis circuit generates a signal at the output of its multivibrator responsive to a first selected clock phase corresponding to the first initialization value;

and wherein the first and second adder legs of the second frequency synthesis circuit receive a second initialization value, and are enabled by a second enable signal so that, when the second enable signal is inactive, the second frequency synthesis circuit generates a signal at the output of its multivibrator responsive to a second selected clock phase corresponding to the second initialization value.

9. The circuit of claim 8, further comprising:
- a first enable multivibrator, for receiving a general enable signal at a data input and receiving the output of the first frequency synthesis circuit at its clock input, for generating the first enable signal responsive to the general enable signal and to a transition of the output of the multivibrator of the first frequency synthesis circuit; and
- a second enable multivibrator, receiving the first enable signal at a data input, and receiving the output of the multivibrator of the second frequency synthesis circuit at its clock input, for generating the second enable signal at an output responsive to the first enable signal and to a transition of the output of the multivibrator of the second frequency synthesis circuit.

10. The circuit of claim 9, wherein the second frequency synthesis circuit further comprises:
- an enable multiplexer, having a first input coupled to the output of the multivibrator of the second frequency synthesis circuit, having a second input coupled to receive the output of the multivibrator of the first frequency synthesis circuit, having an output coupled to the data input of the multivibrator of the second frequency synthesis circuit, and having a select input coupled to receive the second enable signal so that the output of the multivibrator of the first frequency synthesis circuit is applied to the data input of the multivibrator of the second frequency synthesis circuit responsive to the first enable signal being inactive.

11. The circuit of claim 1, wherein the phase-locked loop comprises:
- a phase detector having a first input receiving a reference signal and a second input receiving a feedback signal, for producing an error signal at an output corresponding to a phase difference between the reference and feedback signals;
- a filter for low-pass filtering the error signal;
- a voltage-controlled oscillator for generating the plurality of clock phases at a frequency selected by the filtered error signal, wherein one of the plurality of clock phases is coupled to the phase detector as the feedback signal.

12. The circuit of claim 11, wherein the voltage-controlled oscillator comprises:
- an even-numbered plurality of differential stages, each differential stage having positive and negative inputs and positive and negative outputs;
- wherein, the positive and negative outputs of all but a selected one of the plurality of differential stages are connected to the negative and positive inputs, respectively, of the next adjacent one of the plurality of differential stages;
- and wherein the positive and negative outputs of the selected one of the plurality of differential stages are connected to the positive and negative inputs, respectively, of the next adjacent one of the plurality of differential stages.

13. A method of synthesizing one or more clock signals of a selected frequency and phase, comprising the steps of:
   generating a plurality of clock phases from a phase-locked loop;
   adding a first frequency select value including an integer portion and a fraction portion with a feedback value corresponding to a previous result of the adding step, and storing the result in a first register having an integer portion and a fraction portion;
   selecting a first one of the plurality of clock phases according to the value of the integer portion of the first register;
   adding a portion of the first frequency select value with the feedback value and storing the result in a second register;
   selecting a second one of the plurality of clock phases according to the contents of the second register;
   applying the first and second selected ones of the plurality of clock phases to inputs of a toggle multiplexer;
   selecting the inputs of the toggle multiplexer in a sequence; and
   toggling a flip-flop responsive to a transition of the clock phase at the selected input of the toggle multiplexer, to generate the clock signal.

14. The method of claim 13, wherein the step of selecting the inputs of the toggle multiplexer comprises:
   applying the clock signal to a select input of the toggle multiplexer, so that the first and second inputs of the toggle multiplexer are selected according to the logic level of the clock signal.

15. The method of claim 13, further comprising:
   adding another portion of the first frequency select value with the feedback value and storing the result in a third register;
   selecting a third one of the plurality of clock phases according to the contents of the third register; and
   applying the third selected ones of the plurality of clock phases to an input of the toggle multiplexer.

16. The method of claim 13, further comprising:
   setting first and second enable signals to an inactive state;
   responsive to the first enable signal being inactive, in a first frequency synthesis circuit, selecting the first and second ones of the plurality of clock phases responsive to a first initialization value;
   in a second frequency synthesis circuit, and responsive to the second enable signal being inactive:
      selecting third and fourth one of the plurality of clock phases responsive to a second initialization value, and applying the selected third and fourth ones of the plurality of clock phases to inputs of a second toggle multiplexer;
      selecting the inputs of the second toggle multiplexer in a sequence; and
      toggling a second flip-flop responsive to a transition of the clock phase at the selected input of the toggle multiplexer of the first frequency synthesis circuit, to generate a phase-shifted clock signal.

17. The method of claim 16, further comprising:
   in the first frequency synthesis circuit, then performing the adding, selecting, and applying steps responsive to the first enable signal making a transition from inactive to active; and
   in the second frequency synthesis circuit:
      adding the frequency select value with a feedback value corresponding to a previous result of the adding step, and storing the result in a third register having an integer portion and a fraction portion;
      selecting a third one of the plurality of clock phases according to the value of the integer portion of the third register;
      adding a portion of the frequency select value with the feedback value and storing the result in a fourth register;
      selecting a fourth one of the plurality of clock phases according to the contents of the fourth register;
      applying the third and fourth selected ones of the plurality of clock phases to inputs of a second toggle multiplexer;
      selecting the inputs of the second toggle multiplexer in a sequence; and
      toggling the second flip-flop responsive to a transition of the clock phase at the selected input of the second toggle multiplexer, to generate the phase-shifted clock signal.

18. The method of claim 17, further comprising:
   driving the second enable signal to an active state, responsive to the first enable signal making a transition to the active state.

* * * * *